United States Patent
Chou et al.

(10) Patent No.: US 11,567,477 B2
(45) Date of Patent: Jan. 31, 2023

(54) FAN DRIVING CIRCUIT WITH TEMPERATURE COMPENSATION

(71) Applicant: SEA SONIC ELECTRONICS CO., LTD., Taipei (TW)

(72) Inventors: Sheng-Chien Chou, Taipei (TW); Chih-Sheng Chang, Taipei (TW); Cheng-Yung Lo, Taipei (TW)

(73) Assignee: SEA SONIC ELECTRONICS CO., LTD., Taipei (TW)

( * ) Notice: Subject to any disclaimer, the term of this patent is extended or adjusted under 35 U.S.C. 154(b) by 347 days.

(21) Appl. No.: 17/007,926

(22) Filed: Aug. 31, 2020

(65) Prior Publication Data
US 2022/0066421 A1 Mar. 3, 2022

(51) Int. Cl.
| *G05B 19/41* | (2006.01) |
| *G05D 23/24* | (2006.01) |
| *G05B 19/4155* | (2006.01) |
| *H03K 5/24* | (2006.01) |

(52) U.S. Cl.
CPC ......... *G05B 19/4155* (2013.01); *G05D 23/24* (2013.01); *G05B 2219/42237* (2013.01); *H03K 5/24* (2013.01)

(58) Field of Classification Search
CPC ...... G05B 19/4155; G05B 2219/42237; G05D 23/34; H03K 5/34
See application file for complete search history.

(56) References Cited

U.S. PATENT DOCUMENTS

| 9,998,038 B1* | 6/2018 | Zhang ........................ H02P 3/22 |
| 2009/0034943 A1* | 2/2009 | Ma ............................. H02P 7/29 |
| | | 388/811 |
| 2009/0096402 A1* | 4/2009 | Miyajima ................. H02P 6/16 |
| | | 318/473 |
| 2011/0299247 A1* | 12/2011 | Zhang ....................... H02P 6/08 |
| | | 327/512 |
| 2014/0072449 A1* | 3/2014 | Yao ........................ F04D 27/004 |
| | | 417/42 |
| 2015/0044063 A1* | 2/2015 | Lu ............................. H02P 7/29 |
| | | 417/44.11 |
| 2017/0067664 A1* | 3/2017 | Hu ............................ G06F 1/20 |

FOREIGN PATENT DOCUMENTS

TW  I686541 B  3/2020

* cited by examiner

*Primary Examiner* — Marc E Norman
(74) *Attorney, Agent, or Firm* — Muncy, Geissler, Olds & Lowe, P.C.

(57) ABSTRACT

A fan driving circuit with temperature compensation comprises a power input end, a power output end connected with a fan motor, a first transistor arranged between the power input end and the power output end, a signal adjuster connected with the first transistor and connected with a signal generating circuit, a second transistor connected with the signal adjuster, and a feedback unit. The feedback unit comprises a first resistor and a second resistor connected in series, and a compensation bypass connected in parallel with the first resistor or the second resistor, wherein the compensation bypass comprises a thermistor, a resistance of the thermistor changes along with the temperature and changes a magnitude of a feedback current which is provided to the second transistor, so as to compensate a change of a common emitter current gain in the second transistor generated by the temperature.

10 Claims, 3 Drawing Sheets

FAN DRIVING CIRCUIT WITH TEMPERATURE COMPENSATION

FIELD OF THE INVENTION

The present invention relates to a fan driving circuit, and more particularly, to a fan driving circuit that compensates for a common emitter current gain variation of an associated transistor based on temperature variations.

BACKGROUND OF THE INVENTION

Transistor components all have operating characteristics that vary depending on different operating environment. Referring to FIG. 1, it is a graph showing variation of common emitter current gain (also named hFE or β) of a transistor component at different temperatures. It is clear from FIG. 1 that the higher the operating environment temperature of the transistor component, the higher the common emitter current gain will be.

In the current fan control technology, although a plurality of technologies provide technical solutions for changing a rotating speed of a fan aiming at the ambient temperature, such as Taiwan patent number 1686541 and the like, the emphasis of the technologies is that the rotating speed of the fan is required to be increased when the ambient temperature is increased, and characteristic changes generated by the transistor component are ignored, so that the fan control is not expected.

SUMMARY OF THE INVENTION

A main object of the present invention is to solve the problem that a conventional fan driving circuit does not perform temperature compensation with respect to a transistor and the control is not expected.

To achieve the above object, the invention provides a fan driving circuit with temperature compensation, which comprises a power input end, a power output end connected with a fan motor, a first transistor arranged between the power input end and the power output end, a signal adjuster, a second transistor connected with the signal input end, and a feedback unit. The signal adjuster is provided with a signal input end connected with a signal generating circuit to receive a pulse width modulation signal, a reference voltage input end, and a signal output end connected with the first transistor, wherein the signal adjuster generates a fan driving signal based on the pulse width modulation signal, and the fan driving signal is provided from the signal output end to the first transistor. The feedback unit comprises a first resistor connected with the power output end, a second resistor connected in series with the first resistor, a node positioned between the first resistor and the second resistor to connect with the second transistor, and a compensation bypass connected in parallel with the first resistor or the second resistor, wherein the compensation bypass consists of a thermistor and a third resistor connected in series with the thermistor, and a resistance of the thermistor changes along with the temperature and changes a magnitude of a feedback current which is provided by the node to the second transistor, so as to compensate a change of a common emitter current gain in the second transistor generated by the temperature.

In an embodiment, the compensation bypass is connected in parallel with the first resistor, and the thermistor is a positive temperature coefficient thermistor.

In an embodiment, the compensation bypass is connected in parallel with the second resistor, and the thermistor is a negative temperature coefficient thermistor.

In an embodiment, the first transistor is a PNP bipolar transistor, and the second transistor is an NPN bipolar transistor.

In an embodiment, the fan driving circuit further comprises a fourth resistor arranged between the first transistor and the signal adjuster, and a fifth resistor connected with a first emitter and a first base of the first transistor.

In an embodiment, one end of the second resistor not connected to the node is grounding.

In an embodiment, the fan driving circuit further comprises a sixth resistor including one end connected to a second emitter of the second transistor and the other end grounding.

In an embodiment, the signal adjuster is a comparator.

In an embodiment, the fan driving circuit comprises a seventh resistor electrically connected with the signal generating circuit and the second transistor, and a second capacitor forming an integrating circuit with the seventh resistor.

According to the foregoing of the invention, and compared with the conventional use, the invention has the following characteristics. The compensation bypass connected in parallel with the first resistor or the second resistor is additionally arranged in the feedback unit. According to the thermistor to which the compensation bypass belongs, a resistance of the thermistor changes due to the change of the ambient temperature, so that the feedback current flowing to the second transistor from the feedback unit changes to compensate for a change of a common emitter current gain generated by the temperature of the second transistor.

DETAILED DESCRIPTION OF THE PREFERRED EMBODIMENTS

The detailed description and technical contents of the present invention will now be described with reference to the drawings as follows.

Figure 1:
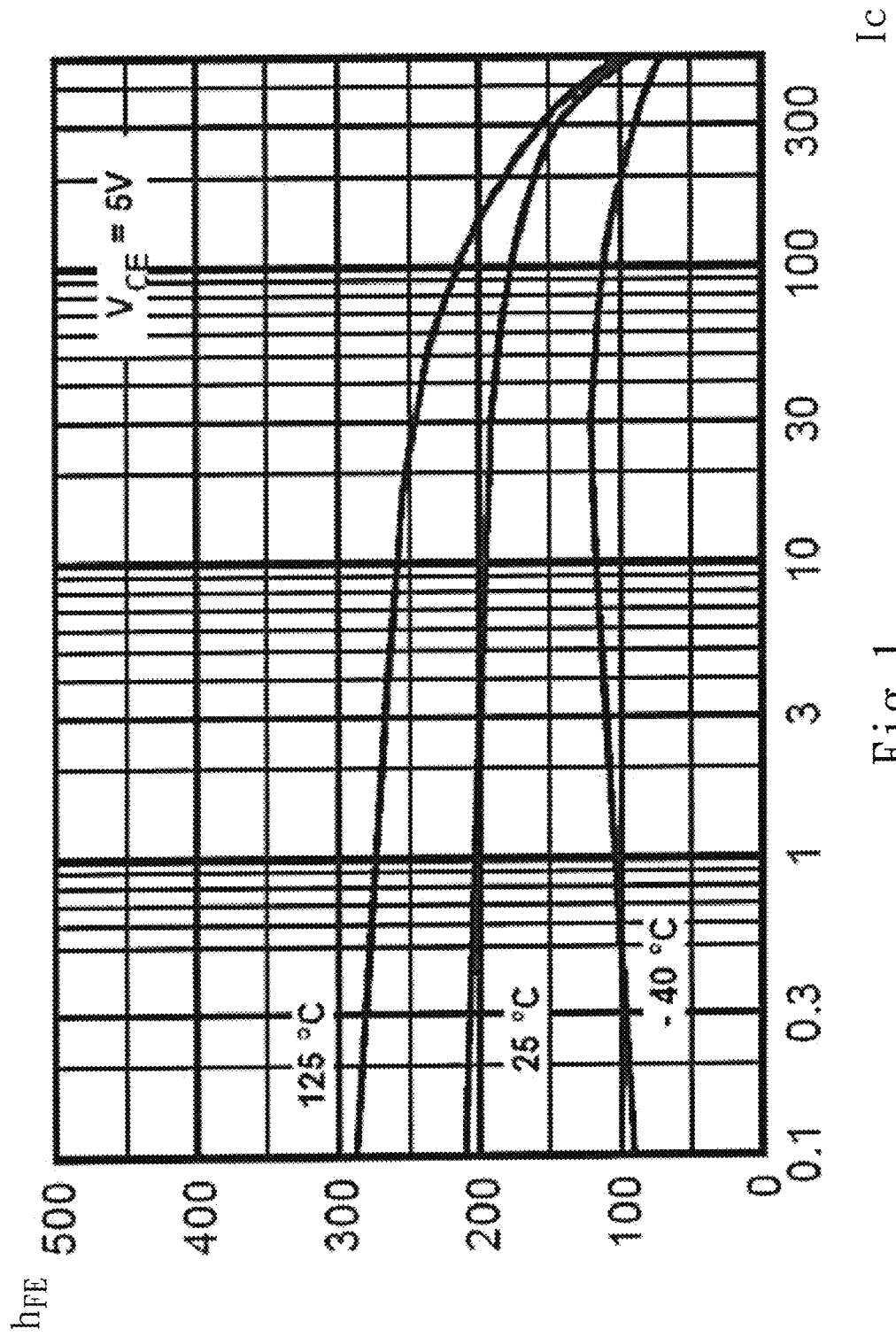
FIG. 1 is a characteristic diagram of an operating environment temperature of a transistor component and common emitter current gain.
Figure 2:
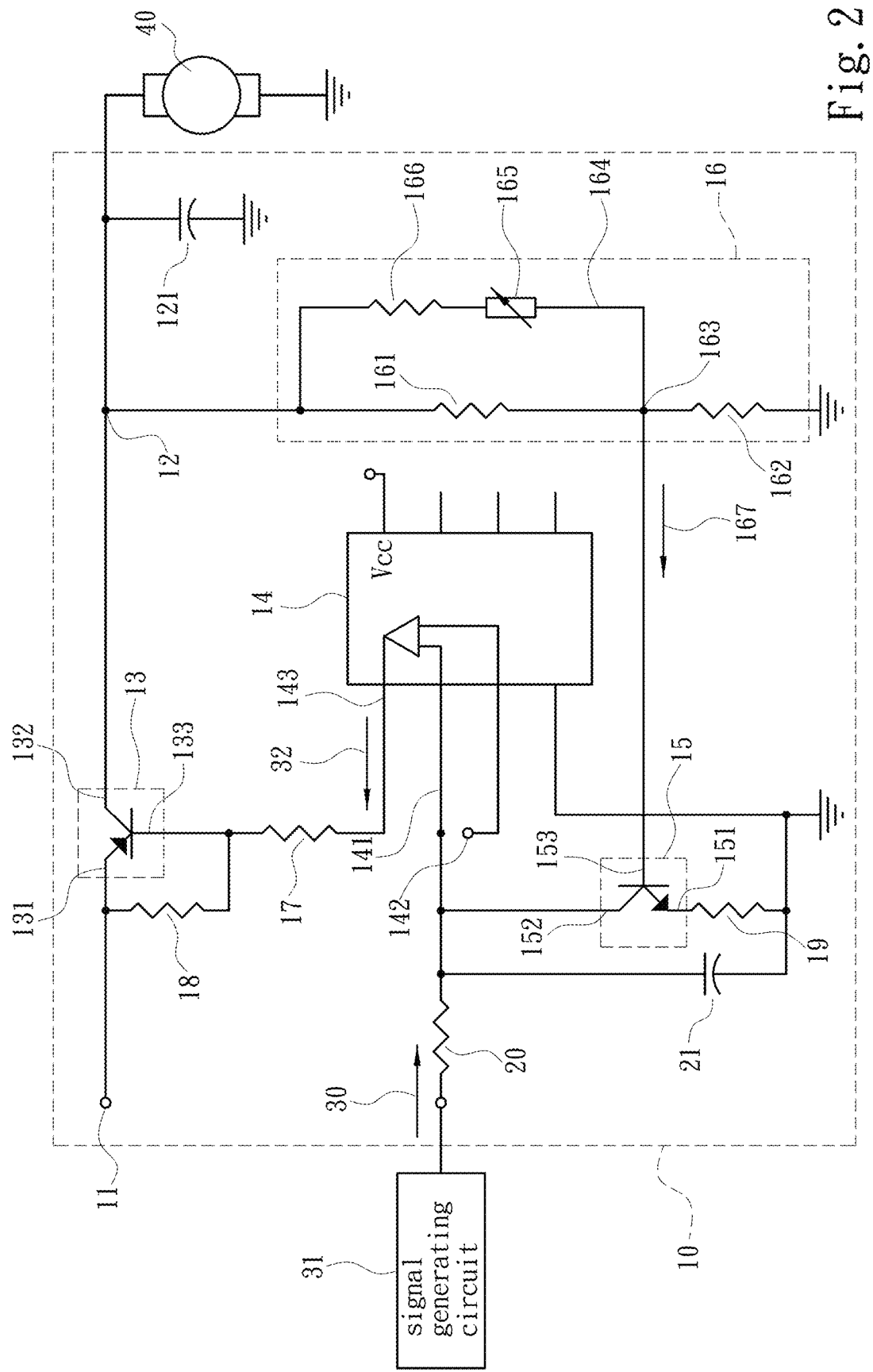
FIG. 2 is a schematic circuit diagram of a fan driving circuit according to a first embodiment of the present invention.

Referring to FIG. 2, the present invention provides a fan driving circuit 10 with temperature compensation, the fan driving circuit 10 obtains a pulse width modulation signal 30 via a signal generating circuit 31, but the fan driving circuit 10 does not directly generate the pulse width modulation signal 30 for determining an operating speed of the fan. More specifically, the fan driving circuit 10 drives the fan with the pulse width modulation signal 30 from the signal generating circuit 31, and the fan driving circuit 10 does not involve an adjustment of the signal generating circuit 31 to the pulse width modulation signal 30 based on the ambient temperature of the fan. In addition, the pulse width modulation signal 30 is not directly applied to the fan, but determines how the fan driving circuit 10 drives the fan.

Accordingly, the fan driving circuit 10 of the present invention comprises a power input end 11, a power output end 12, a first transistor 13, a signal adjuster 14, a second transistor 15, and a feedback unit 16. The power input end 11 obtains power from a power source, the power output end 12 is connected with a fan motor 40, and the first transistor 13 is arranged between the power input end 11 and the power output end 12. In an embodiment, the first transistor 13 is a PNP bipolar transistor, a first emitter 131 of the first transistor 13 is connected to the power input end 11, and a first collector 132 of the first transistor 13 is connected to the power output end 12. Furthermore, the signal adjuster 14 includes a signal input end 141, a reference voltage input end 142 and a signal output end 143. The signal input end 141 is connected to the signal generating circuit 31 to receive the pulse width modulation signal 30, the reference voltage input end 142 is connected to a reference voltage source, and the voltage value of the reference voltage source is selected according to operating parameters of the signal adjuster 14. Further, the signal adjuster 14 receives and modulates the pulse width modulation signal 30 into a fan control signal 32, and the purpose of dividing the signal into the pulse width modulation signal 30 and the fan control signal 32 herein is to specifically illustrate that the fan control signal 32 can still be implemented by the pulse width modulation technology in practice. In addition, the signal output end 143 is connected to the first transistor 13. Specifically, the signal output end 143 is connected to a first base 133 of the first transistor 13, and the signal output end 143 provides the fan control signal 32 to the first transistor 13. The first transistor 13 operates based on the fan control signal 32 to drive the fan motor 40. In an embodiment, the signal adjuster 14 may be a comparator. Furthermore, the second transistor 15 is connected to the signal input end 141 of the signal adjuster 14 and the feedback unit 16. In an embodiment, the second transistor 15 is an NPN bipolar transistor, a second collector 152 of the second transistor 15 is electrically connected to the signal input end 141, and a second base 153 of the second transistor 15 is connected to the feedback unit 16.

Figure 3:
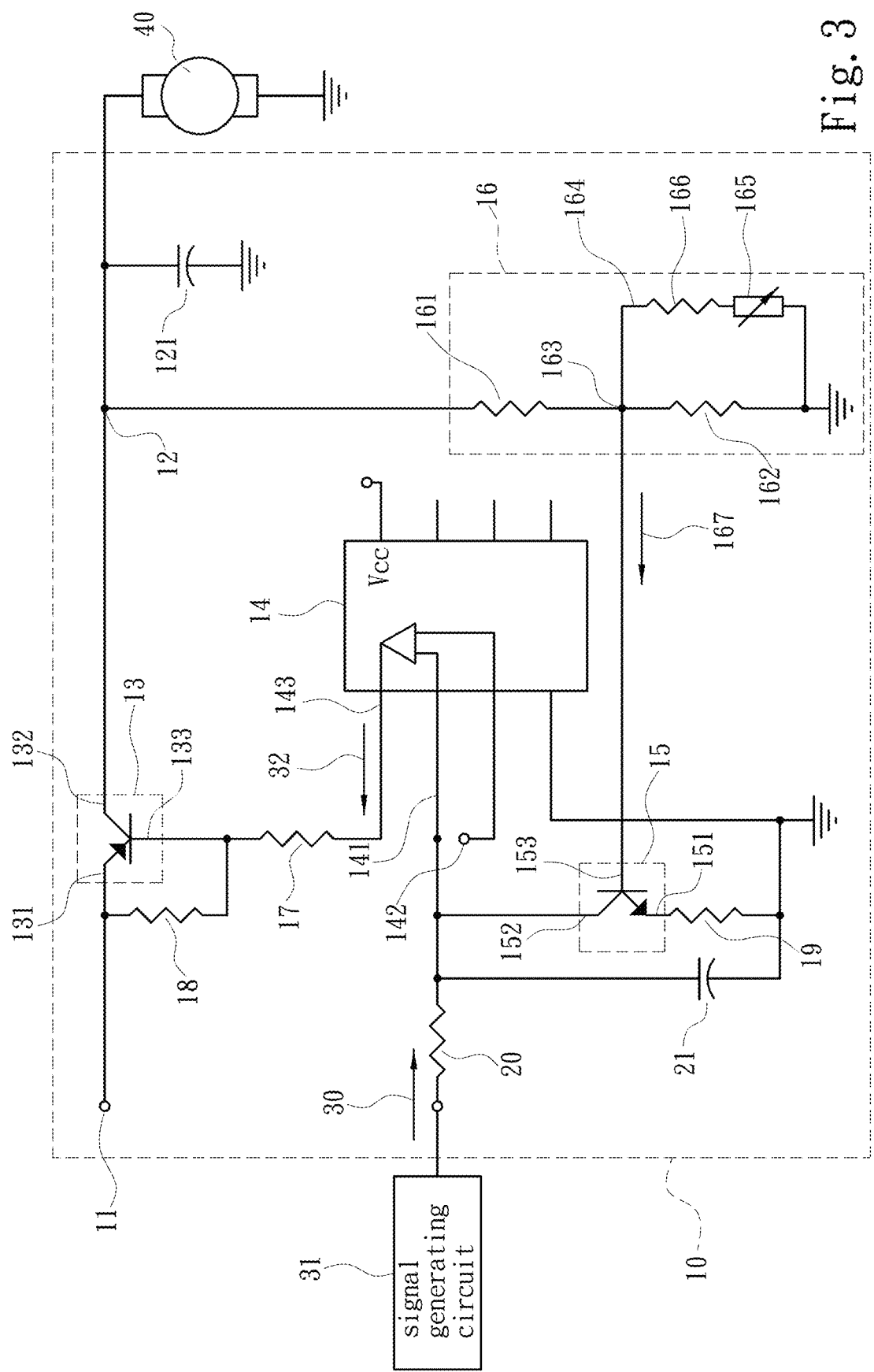
FIG. 3 is a schematic circuit diagram of a fan driving circuit according to a second embodiment of the present invention.

Referring to FIG. 2 and FIG. 3, the feedback unit 16 of the present invention comprises a first resistor 161 connected to the power output end 12, a second resistor 162 connected in series with the first resistor 161, a node 163 positioned between the first resistor 161 and the second resistor 162 and connected with the second transistor 15, and a compensation bypass 164 connected in parallel with the first resistor 161 or the second resistor 162. Here, one end of the second resistor 162 without connecting to the node 163 is grounding. The node 163 of the feedback unit 16 is electrically connected to the second base 153 of the second transistor 15. The compensation bypass 164 is comprised of a thermistor 165 and a third resistor 166 connected in series with the thermistor 165. In an embodiment in which the compensation bypass 164 is connected in parallel with the first resistor 161, the thermistor 165 is implemented by a positive temperature coefficient thermistor. In an embodiment in which the compensation bypass 164 is connected in parallel with the second resistor 162, the thermistor 165 is implemented by a negative temperature coefficient thermistor. Accordingly, a resistance of the thermistor 165 will be changed based on the ambient temperature in a space in which the fan driving circuit 10 is disposed. A feedback current 167 is provided by the node 163 to the second base 153 of the second transistor 15, wherein a magnitude of the feedback current is changed as soon as the thermistor changes. The feedback current 167 of the present invention is changed on the basis of temperature so as to compensate a change of a common emitter current gain (also named hFE or β) in the second transistor 15 generated by temperature, solving the problem that conventional circuits change in characteristics due to the influence of temperature on the second transistor 15 which resulting in different control results for the same control parameter.

Referring to FIG. 2, in an embodiment, the fan driving circuit 10 further comprises a fourth resistor 17 arranged between the first transistor 13 and the signal adjuster 14, and a fifth resistor 18 connected between the first emitter 131 and the first base 133 of the first transistor 13. Further, the fan driving circuit 10 may further comprise a sixth resistor 19 including one end connected to a second emitter 151 of the second transistor 15 and the other end is grounding. In addition, in an embodiment, the fan driving circuit 10 includes a first capacitor 121 arranged at the power output end 12. Further, the fan driving circuit 10 comprises a seventh resistor 20 electrically connected with the signal generating circuit 31 and the second collector 152 of the second transistor 15, and a second capacitor 21 forming an integrating circuit with the seventh resistor 20. A positive end of the second capacitor 21 is connected to the second collector 152 of the second transistor 15, and a negative end of the second capacitor 21 is connected to a grounded end of the sixth resistor 19. In the embodiment, after the pulse width modulation signal 30 is output from the signal generating circuit 31, the pulse width modulation signal 30 is firstly effected by the integrating circuit, and then is synthesized with a feedback signal of the second transistor 15, and finally enters the signal adjuster 14, so that the signal adjuster 14 generates the fan control signal 32.

What is claimed is:
1. A fan driving circuit with temperature compensation, comprising:
   a power input end;
   a power output end, connected with a fan motor;
   a first transistor, arranged between the power input end and the power output end;
   a signal adjuster, comprising a signal input end connected with a signal generating circuit to receive a pulse width modulation signal, a reference voltage input end, and a signal output end connected with the first transistor, wherein the signal adjuster generates a fan driving signal based on the pulse width modulation signal, and the fan driving signal is provided from the signal output end to the first transistor;
   a second transistor, connected to the signal input end; and
   a feedback unit, comprising a first resistor connected with the power output end, a second resistor connected in series with the first resistor, a node positioned between the first resistor and the second resistor to connect with the second transistor, and a compensation bypass connected in parallel with the first resistor or the second resistor, wherein the compensation bypass consists of a thermistor and a third resistor connected in series with the thermistor, a resistance of the thermistor changes along with a temperature and changes a magnitude of a feedback current which is provided by the node to the second transistor, so as to compensate a change of a common emitter current gain in the second transistor generated by the temperature.

2. The fan driving circuit with temperature compensation of claim 1, wherein the compensation bypass is connected in parallel with the first resistor, and the thermistor is a positive temperature coefficient thermistor.

3. The fan driving circuit with temperature compensation of claim 1, wherein the compensation bypass is connected in parallel with the second resistor, and the thermistor is a negative temperature coefficient thermistor.

4. The fan driving circuit with temperature compensation of claim 1, wherein the first transistor is a PNP bipolar transistor, and the second transistor is an NPN bipolar transistor.

5. The fan driving circuit with temperature compensation of claim 4, wherein the fan driving circuit further comprises a fourth resistor arranged between the first transistor and the signal adjuster, and a fifth resistor connected with a first emitter and a first base of the first transistor.

6. The fan driving circuit with temperature compensation of claim 5, wherein the fan driving circuit further comprises a sixth resistor including one end connected to a second emitter of the second transistor and the other end grounding.

7. The fan driving circuit with temperature compensation of claim 6, wherein the signal adjuster is a comparator.

8. The fan driving circuit with temperature compensation of claim 4, wherein one end of the second resistor not connected to the node is grounding.

9. The fan driving circuit with temperature compensation of claim 1, wherein the signal adjuster is a comparator.

10. The fan driving circuit with temperature compensation of claim 1, wherein the fan driving circuit comprises a seventh resistor electrically connected with the signal generating circuit and the second transistor, and a second capacitor forming an integrating circuit with the seventh resistor.

* * * * *